US010073164B2

(12) United States Patent
Otani et al.

(10) Patent No.: US 10,073,164 B2
(45) Date of Patent: Sep. 11, 2018

(54) DISTANCE-MEASURING/IMAGING APPARATUS, DISTANCE MEASURING METHOD OF THE SAME, AND SOLID IMAGING ELEMENT

(71) Applicant: Panasonic Intellectual Property Management Co., Ltd., Osaka (JP)

(72) Inventors: Mitsuhiko Otani, Hyogo (JP); Toshiya Fujii, Shiga (JP); Junji Tokumoto, Osaka (JP); Haruka Takano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 460 days.

(21) Appl. No.: 14/965,901

(22) Filed: Dec. 11, 2015

(65) Prior Publication Data

US 2016/0097841 A1 Apr. 7, 2016

Related U.S. Application Data

(63) Continuation of application No. PCT/JP2014/002714, filed on May 23, 2014.

(30) Foreign Application Priority Data

Jun. 26, 2013 (JP) ................................ 2013-134315

(51) Int. Cl.
*G01S 7/48* (2006.01)
*G01S 7/486* (2006.01)
(Continued)

(52) U.S. Cl.
CPC .............. *G01S 7/4808* (2013.01); *G01C 3/08* (2013.01); *G01S 7/4868* (2013.01); *G01S 17/10* (2013.01);
(Continued)

(58) Field of Classification Search
None
See application file for complete search history.

(56) References Cited

U.S. PATENT DOCUMENTS 6,373,557 B1* 4/2002 Mengel ................. B60N 2/002
356/4.07
2016/0178734 A1* 6/2016 Kawamura ............ G01S 17/89
356/5.01

FOREIGN PATENT DOCUMENTS

JP 2001-148867 5/2001
JP 2010-256291 11/2010
JP 2012-215480 11/2012

OTHER PUBLICATIONS

International Search Report of PCT application No. PCT/JP2014/002714 dated Aug. 26, 2014.

* cited by examiner

*Primary Examiner* — Eric L Bolda
(74) *Attorney, Agent, or Firm* — Michael E. Fogarty

(57) ABSTRACT

A distance-measuring/imaging apparatus having a high S/N and a high distance measurement accuracy is provided. The distance-measuring/imaging apparatus includes: a signal generation unit for generating an emission signal and exposure signal; a light source unit for performing light irradiation by receiving the emission signal; an imaging unit for performing exposure by receiving the exposure signal and for acquiring the exposure amount of the reflected light; and a calculation unit for calculating and outputting the distance information on the basis of the exposure amount. The imaging unit acquires a first exposure amount corresponding to the exposure in a first emission/exposure period, in which the exposure is performed by receiving the exposure signal simultaneously with a receiving timing of the emission signal. The imaging unit acquires a second exposure amount
(Continued)

corresponding to the exposure in a second emission/exposure period, in which the exposure is performed by receiving the exposure signal after a lapse of a delay time from the receiving timing of the emission signal. The calculation unit calculates the distance information on the basis of the first exposure amount and second exposure amount that are acquired by changing the repeat count of the emission signal in the first emission/exposure period.

8 Claims, 12 Drawing Sheets

(51) Int. Cl.
    *G01S 17/10*     (2006.01)
    *G01S 17/89*     (2006.01)
    *H01L 27/148*     (2006.01)
    *G01C 3/08*     (2006.01)

(52) U.S. Cl.
    CPC ........ *G01S 17/89* (2013.01); *H01L 27/14843* (2013.01)

FIG. 7

DISTANCE-MEASURING/IMAGING APPARATUS, DISTANCE MEASURING METHOD OF THE SAME, AND SOLID IMAGING ELEMENT

TECHNICAL FIELD

The present disclosure relates to a distance-measuring/imaging apparatus and a distance measuring method thereof.

BACKGROUND ART

Among a plurality of methods of detecting an object, a time of flight (TOF) method of measuring the distance using the time of flight, which is the period taken for go and return of light from the object, is known.

Patent Literature 1 discloses a conventional technology for dividing a light reception signal time into three or four light reception signal periods of different phases that are shorter than the light emission signal time, and calculating a distance measurement value on the basis of the light quantities acquired in the light reception signal periods.

CITATION LIST

Patent Literature

PTL 1: Unexamined Japanese Patent Publication No. 2012-215480

SUMMARY OF THE INVENTION

However, the conventional technology disclosed in Patent Literature 1 has a problem in which the S/N (signal/noise ratio) of the light reception signal is low and the distance measurement accuracy is low.

In order to address the problem, the present disclosure provides a distance-measuring/imaging apparatus having a high S/N and a high distance measurement accuracy, and a distance measuring method of the distance-measuring/imaging apparatus.

In order to solve the problem, the distance-measuring/imaging apparatus of an exemplary embodiment of the present disclosure includes the following components:
  a signal generation unit for generating an emission signal for commanding the light irradiation and an exposure signal for commanding the exposure to reflected light;
  a light source unit for performing the light irradiation by receiving the emission signal;
  an imaging unit for performing the exposure by receiving the exposure signal and for acquiring the exposure amount of the reflected light; and
  a calculation unit for calculating and outputting the distance information on the basis of the exposure amount.

The imaging unit acquires a first exposure amount corresponding to the exposure in a first emission/exposure period, and acquires a second exposure amount corresponding to the exposure in a second emission/exposure period. Here, in the first emission/exposure period, the exposure is performed by receiving the exposure signal after a lapse of a first delay time from a receiving timing of the emission signal. In the second emission/exposure period, the exposure is performed by receiving the exposure signal after a lapse of a second delay time, which is different from the first delay time, from the receiving timing of the emission signal. The calculation unit calculates the distance information on the basis of the first exposure amount and second exposure amount that are acquired by changing at least one of the following repeat counts:
  the repeat count of at least one of the emission signal and the exposure signal in the first emission/exposure period; and
  the repeat count of at least one of the emission signal and the exposure signal in the second emission/exposure period.

This configuration changes at least one of the repeat count of at least one of the emission signal and the exposure signal in the first emission/exposure period, and the repeat count of at least one of the emission signal and the exposure signal in the second emission/exposure period. Therefore, a high S/N and a high distance measurement accuracy can be achieved without depending on the emission intensity and the distance to an object. Furthermore, the emission intensity can be suppressed, and hence the power consumption can be reduced.

The distance-measuring/imaging apparatus of an exemplary embodiment of the present disclosure further includes a control unit. The control unit changes and controls at least one of the repeat count in the first emission/exposure period and the repeat count in the second emission/exposure period so that each of the following sum totals approaches a maximum exposure capacity of the imaging unit. The sum totals are:
  the sum total of the first exposure amounts acquired by repeating the exposure in the first emission/exposure period; and
  the sum total of the second exposure amounts acquired by repeating the exposure in the second emission/exposure period.

The control unit outputs a correction signal for correcting the distance information to the calculation unit on the basis of the changed and controlled repeat count. The calculation unit calculates and outputs the distance information on the basis of the correction signal.

Thus, the maximum reception amount of each of the sum total of the first exposure amounts and the sum total of the second exposure amounts is always large, so that a high S/N and a high distance measurement accuracy can be achieved.

For example, the signal generation unit outputs the emission signal and exposure signal in the emission/exposure period in which the repeat count is lower, of the first emission/exposure period and the second emission/exposure period, at generating timings moved closer to the emission/exposure period in which the repeat count is higher.

Thus, the time difference between the first emission/exposure period and the second emission/exposure period is short, so that even the distance to a measuring object moving fast can be accurately measured.

Furthermore, for example, the signal generation unit generates a first exposure signal in the first emission/exposure period, and generates a second exposure signal in the second emission/exposure period. Here, the output timing of the second exposure signal with respect to the emission signal is different from the output timing of the first exposure signal. The output period of the first exposure signal includes a start point of the reflected light, and the output period of the second exposure signal includes an end point of the reflected light. The end timing of the first exposure signal coincides with the start timing of the second exposure signal, or is temporally ahead of the start timing of the second exposure signal.

When the end timing of the first exposure signal coincides with the start timing of the second exposure signal, the output period of the first exposure signal is temporally separated from the output period of the second exposure signal. Thus, each exposure period can be reduced, and a distance-measuring/imaging apparatus in which the distance measurement accuracy is improved and the background light tolerant is improved can be achieved. When the end timing of the first exposure signal is temporally ahead of the start timing of the second exposure signal, the exposure period is further divided into three periods: a first exposure period, a second exposure period, and a no-sensitivity period. Thus, each exposure period is reduced, and the improvement of the distance measurement accuracy and the improvement of the background light tolerant are accelerated.

Furthermore, for example, the signal generation unit generates the emission signal a plurality of times and the first exposure signal a plurality of times in the first emission/exposure period, and generates the emission signal a plurality of times and the second exposure signal a plurality of times in the second emission/exposure period.

Furthermore, for example, the imaging unit includes a charge coupled device (CCD) type solid imaging element.

Thus, as a means for accumulating signals acquired in a plurality of different exposure periods, a plurality of packets that are already formed in a vertical transfer unit can be used. Therefore, additionally forming a signal accumulating means is not required, photodiodes can be enlarged when the area is constant, the saturation sensitivity can be increased, the maximum reception amount can be increased, and accurate distance measurement can be achieved. An operation of collectively resetting the plurality of photodiodes—the so-called global reset—can be performed, and accurate distance measurement can be achieved.

The present disclosure can achieve not only a distance-measuring/imaging apparatus including such a characteristic configuration, but also a distance measuring method of the distance-measuring/imaging apparatus.

The distance-measuring/imaging apparatus of the present disclosure changes at least one of the following repeat counts:
  the repeat count of at least one of the emission signal and the exposure signal in the first emission/exposure period; and
  the repeat count of at least one of the emission signal and the exposure signal in the second emission/exposure period.

Therefore, a high S/N and a high distance measurement accuracy can be achieved.

BRIEF DESCRIPTION OF DRAWINGS

FIG. 7 is a diagram showing an example of the relation of the exposure amount on one screen of the distance-measuring/imaging apparatus in accordance with the first exemplary embodiment.

DESCRIPTION OF EMBODIMENTS

Hereinafter, distance-measuring/imaging apparatuses of exemplary embodiments of the present disclosure are described with reference to the accompanying drawings. Each of the following exemplary embodiments shows a specific example of the present disclosure. The numerical values, shapes, materials, components, arrangement positions of the components, and connection configurations are one example, and do not limit the present invention.

First Exemplary Embodiment

Figure 1:
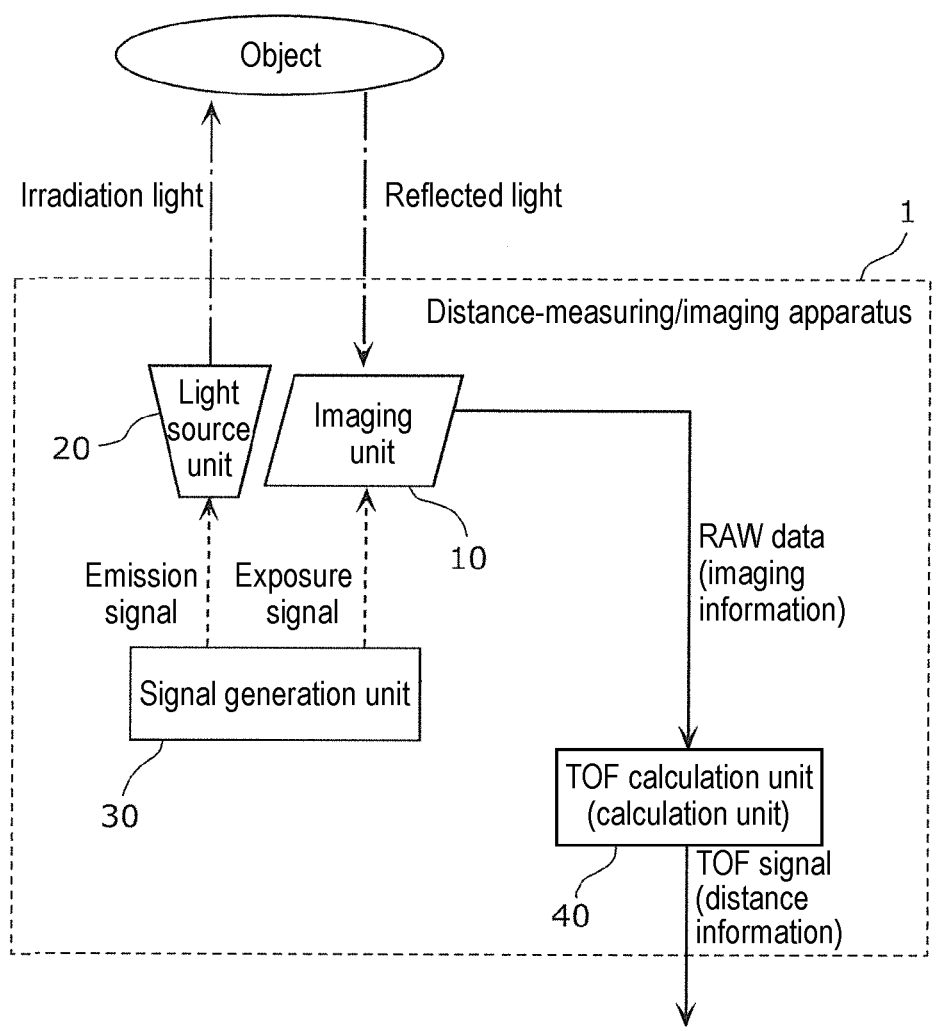
FIG. 1 is a function block diagram showing the schematic configuration of a distance-measuring/imaging apparatus in accordance with a first exemplary embodiment.

FIG. 1 is a function block diagram showing the schematic configuration of distance-measuring/imaging apparatus 1 in accordance with a first exemplary embodiment. As shown in FIG. 1, distance-measuring/imaging apparatus 1 includes imaging unit 10, light source unit 20, signal generation unit 30, and TOF calculation unit (calculation unit) 40.

Light source unit 20 includes a driving circuit, a capacitor, and a light emitting element, and emits light by supplying a charge stored in the capacitor to a light emitting diode. As the light emitting element, another light emitting element such as a laser diode or light emitting diode (LED) may be used.

Signal generation unit 30 generates an emission signal for commanding the light irradiation of an object, and an exposure signal for commanding the exposure to the light reflected from the object.

Light source unit 20 irradiates the object with light at a timing of receiving the emission signal generated by signal generation unit 30.

Imaging unit 10 exposes to light from a region including the object a plurality of times at timings indicated by the exposure signals generated by signal generation unit 30, and acquires RAW data (imaging information) corresponding to the sum total of a plurality of exposure amounts. Imaging unit 10 includes a circuit for generating and outputting RAW data of a camera lens, a solid imaging element, an A/D (analog-to-digital) converter, or the like.

TOF calculation unit (calculation unit) 40 calculates a TOF signal (distance signal) as information of the distance to the object on the basis of the RAW data received from imaging unit 10, and outputs the TOF signal.

Next, the case is described where imaging unit 10 of distance-measuring/imaging apparatus 1 of the present exemplary embodiment employs a CCD (charge coupled device) type solid imaging element.

Figure 2:
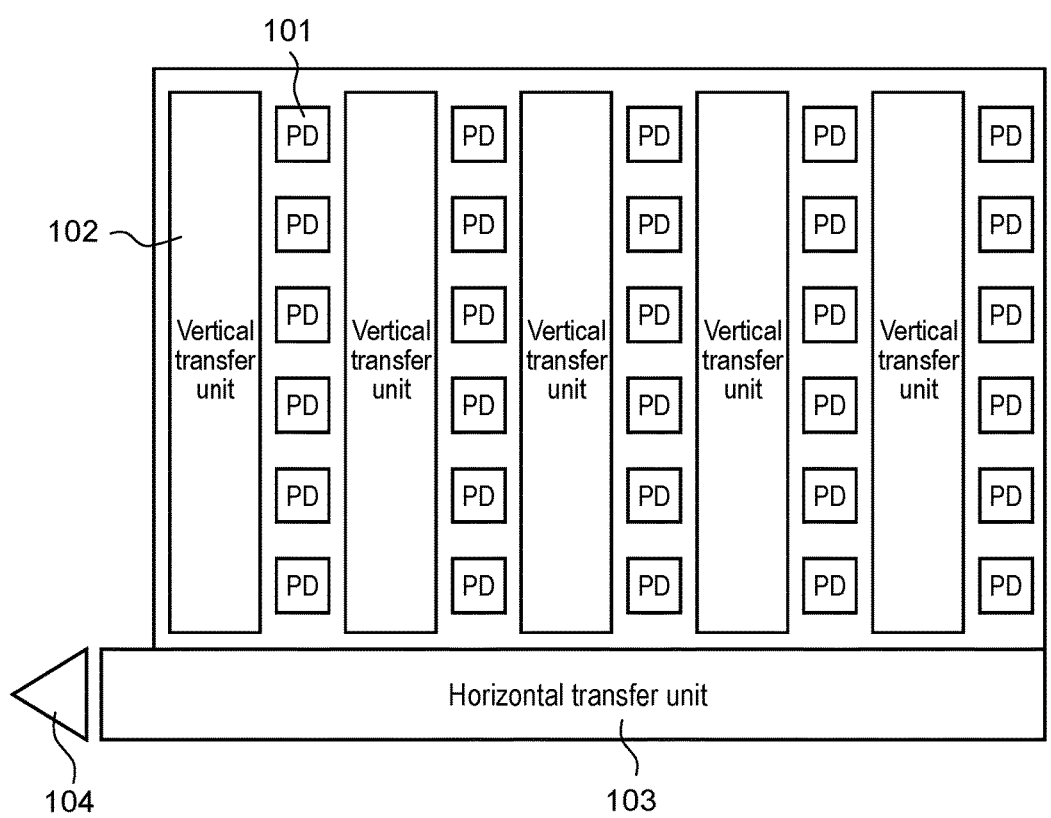
FIG. 2 is a function configuration diagram of a CCD type solid imaging element.

FIG. 2 is a function configuration diagram of the CCD type solid imaging element. As shown in FIG. 2, the CCD type solid imaging element includes photodiodes 101, vertical transfer units 102, horizontal transfer unit 103, and signal charge detection unit 104.

Each photodiode 101 converts the received light into a charge.

Each vertical transfer unit 102 includes a plurality of gates, and sequentially transfers the charges read from photodiodes 101 in the vertical direction.

Horizontal transfer unit 103 includes a plurality of gates, and the plurality of gates serve as packets and sequentially transfer the charges received from vertical transfer units 102 in the horizontal direction.

Signal charge detection unit 104 sequentially detects each charge received from the horizontal transfer unit, converts the charge into a voltage signal, and outputs the voltage signal.

Here, in the state where a readout gate is open, the substrate voltage is controlled in accordance with the exposure signal, photodiodes 101 are exposed in the period in which the exposure signal is at the Low level, and the charge generated by the exposure is accumulated in vertical transfer units 102.

Figure 3:
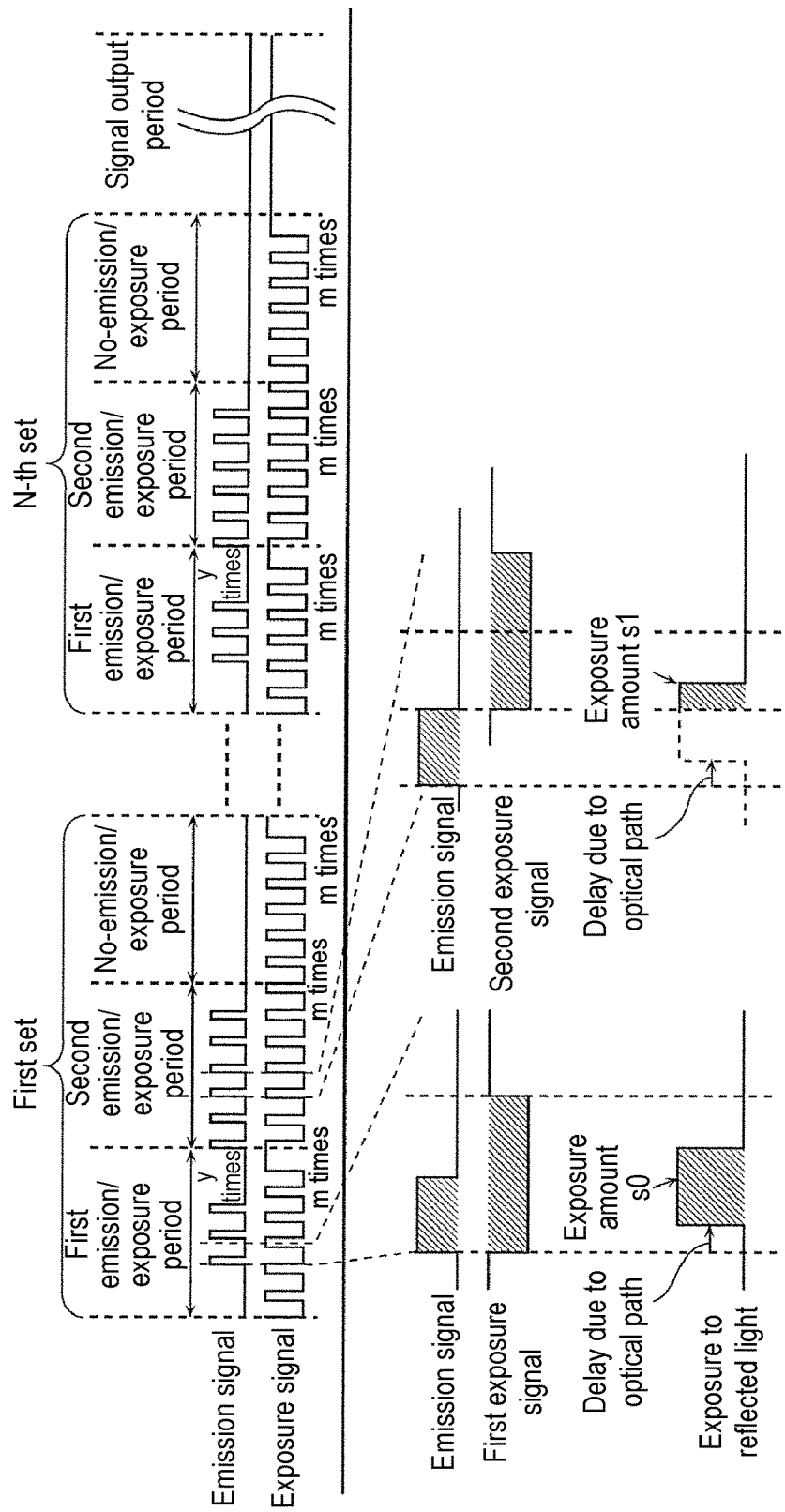
FIG. 3 is a diagram illustrating the timing of detecting an exposure amount of the distance-measuring/imaging apparatus in accordance with the first exemplary embodiment.

FIG. 3 is a diagram illustrating the timing of detecting an exposure amount of the distance-measuring/imaging apparatus in accordance with the first exemplary embodiment. The upper part of FIG. 3 shows the timings at which signal generation unit 30 outputs the emission signal and exposure signal. The lower left part of FIG. 3 shows the detection timing of exposure amount S0 in a first emission/exposure period. The lower center part of FIG. 3 shows the detection timing of exposure amount S1 in a second emission/exposure period. As shown in the upper part and lower left part of FIG. 3, in the first emission/exposure period, photodiodes 101 are exposed to light in the period in which a first exposure signal is at the Low level, and the charge generated by the exposure is accumulated in vertical transfer units 102. At the time when the first emission/exposure period is completed, the gates of vertical transfer units 102 are controlled, and the charge is transferred to a packet that does not have a readout gate. Here, the first emission/exposure period means the period in which, after a lapse of a first delay time from the timing when imaging unit 10 receives an emission signal, the exposure signal is received and exposure is performed. In the present exemplary embodiment, the first delay time is set at zero.

Subsequently, as shown in the upper part and lower center part of FIG. 3, in the second emission/exposure period, photodiodes 101 are exposed to light in the period in which a second exposure signal is at the Low level, and the charge generated by the exposure is accumulated in vertical transfer units 102. At the time when the second emission/exposure period is completed, the gates of vertical transfer units 102 are controlled, and the charge is transferred to the packet that does not have a readout gate. Here, the second emission/exposure period means the period in which, after a lapse of a second delay time, which is different from the first delay time, from the timing when imaging unit 10 receives an emission signal, an exposure signal is received and exposure is performed. In the present exemplary embodiment, the second delay time is set equal to the period in which the emission signal is transmitted (at the High level).

Subsequently, as shown in the upper part of FIG. 3, in the no-emission/exposure period, photodiodes 101 are exposed in the period in which the exposure signal is at the Low level, and the charge generated by the exposure is accumulated in vertical transfer units 102. At the time when the no-emission/exposure period is completed, the gates of vertical transfer units 102 are controlled, and the charge generated by the exposure caused by the first exposure signal is transferred to a packet having a readout gate. After this series of operations is repeated N times, the transfer by vertical transfer units 102 and the transfer by horizontal transfer unit 103 are sequentially repeated. Then, signal charge detection unit 104 converts the charge into a voltage signal, and outputs the voltage signal.

Thus, as a means for accumulating signals acquired in a plurality of exposure periods, the plurality of packets already formed in vertical transfer units 102 can be used. Here, in the exposure periods, the exposure signal for receiving the light reflected from the measuring object is generated at mutually different timings with respect to the emission signal. Therefore, additionally forming a signal accumulating means is not required, photodiodes 101 can be enlarged when the area is constant, the saturation sensitivity can be increased, the maximum reception amount can be increased, and accurate distance measurement can be achieved.

In FIG. 2, by using the CCD image sensor (CCD type solid imaging element), an operation of collectively resetting the plurality of photodiodes 101—the so-called global reset—can be performed, and a further accurate distance measurement can be achieved. However, the solid imaging element used for the present exemplary embodiment is not limited to the CCD image sensor. A similar advantage (improvement of the distance measurement accuracy by improvement of S/N or the like) can be obtained even using another solid imaging element (image sensor) such as a complementary metal oxide semiconductor (CMOS) image sensor (CMOS type solid imaging element) in consideration of another requirement as the distance-measuring/imaging apparatus.

Hereinafter, in order to allow the distance-measuring/imaging apparatus of the present disclosure to be easily understood, a general distance-measuring/imaging apparatus is described using FIG. 4 to FIG. 6.

Figure 4:
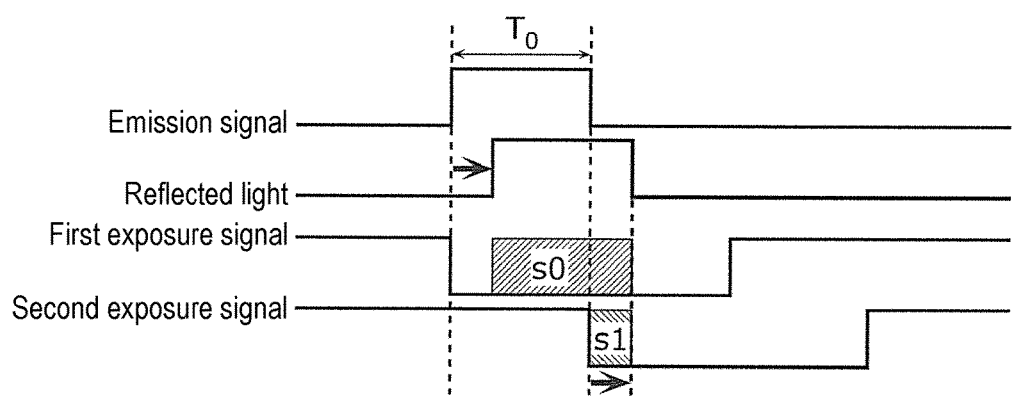
FIG. 4 is a timing chart of an emission signal and exposure signal in a general TOF method.

FIG. 4 is a timing chart of an emission signal and exposure signal in a general TOF method. In FIG. 4, when the distance to the measuring object is measured using the TOF method, the exposure to the light reflected from the measuring object is performed in two patterns. Here, in the two patterns, a first exposure signal and a second exposure signal are generated at mutually different timings with respect to the emission signal. Generally, the method is employed in which the distance to the measuring object is calculated on the basis of the ratio between light quantities generated by the two patterns of exposure. For example, the exposure caused by the first exposure signal is performed so that the whole of the light reflected from the measuring object is included. While, the exposure caused by the second exposure signal is performed so that the exposure amount increases as the light reflected from the measuring object lags behind the emission timing. In order to detect an offset component such as background light, the generation of the emission signal is stopped, and exposure is performed under the same conditions as those of the first exposure signal and second exposure signal.

Here, the sum total of first exposure amounts s0 by the first exposure signal is denoted with S0, the sum total of second exposure amounts s1 by the second exposure signal is denoted with S1, the sum total of the exposure amounts by the background light is denoted with BG, the emission signal width of the direct light to be radiated is denoted with T0, and the light velocity (299,792,458 m/s) is denoted with c. Distance L can be calculated on the basis of expression 1.

$$L = \frac{c \cdot T_0}{2} \times \left( \frac{S1 - BG}{S0 - BG} \right) \quad \text{[Expression 1]}$$

Figure 5:
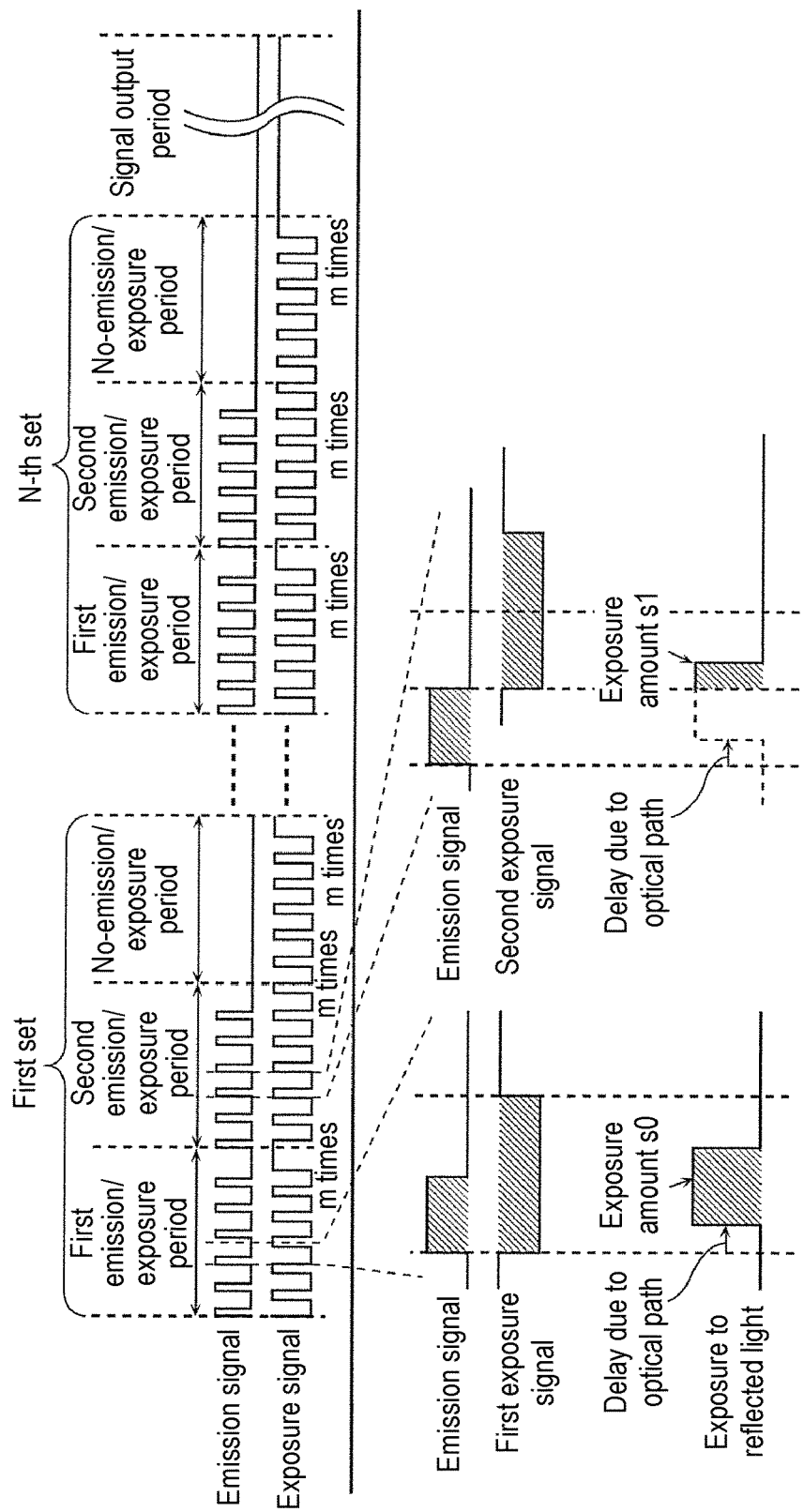
FIG. 5 is a diagram illustrating the timing of detecting an exposure amount in the general TOF method.

FIG. 5 is a diagram illustrating the timing of detecting an exposure amount in the general TOF method. The upper part of FIG. 5 shows the timings at which the emission signal and exposure signal are output. The lower left part of FIG. 5 shows the detection timing of exposure amount s0 in a first emission/exposure period. The lower center part of FIG. 5 shows the detection timing of exposure amount s1 in a second emission/exposure period. First, the emission signal and the first exposure signal are output repeatedly a plurality of times. Then, the emission signal and the second exposure signal are output repeatedly the same number of times. Then, the output of the emission signal is stopped, and an exposure signal is output repeatedly the same number of times under the same condition as that of the first exposure signal and second exposure signal. This series of timings is assumed to be one set, and a plurality of sets of outputs are repeated. After that, the accumulated exposure signal is output.

Furthermore, the distance measurement accuracy depends on the S/N (signal/noise ratio) of a signal. The noise in the TOF method is mainly an optical shot noise, and hence the S/N of the signal is proportional to the square root of the maximum reception amount.

However, the exposure by the first exposure signal is performed so that the whole of the light reflected from the measuring object is included, and the exposure by the second exposure signal is performed so that the exposure amount increases as the light reflected from the measuring object lags behind the emission timing. Thus, sum total S1 of second exposure amounts s1 obtained when the second exposure signal is repeated the plurality of times is always smaller than sum total S0 of first exposure amounts s0 obtained when the first exposure signal is repeated the same number of times. Therefore, the maximum reception amount is small, the S/N decreases, and the distance measurement accuracy decreases.

Figure 6:
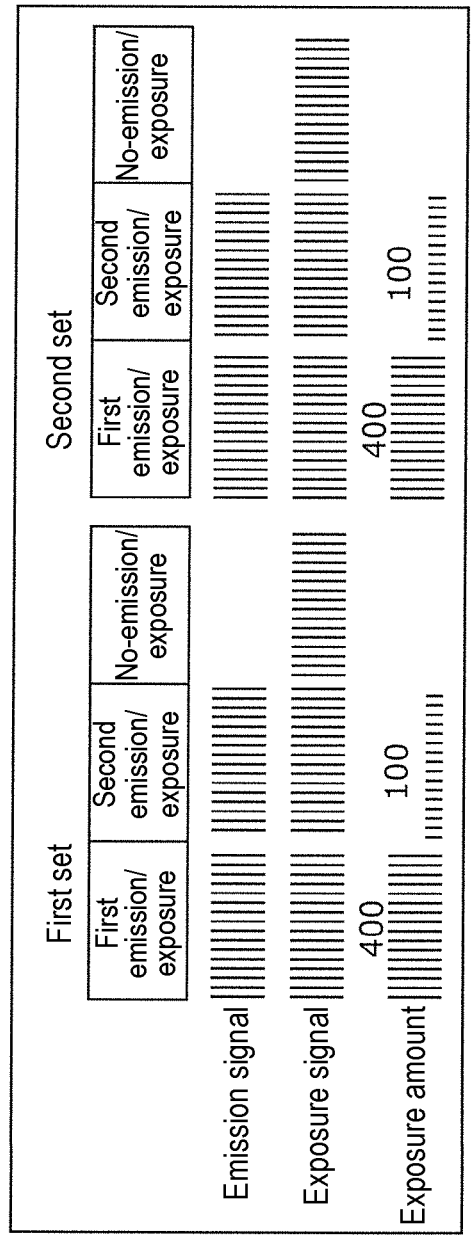
FIG. 6 is a diagram showing the relation of the exposure amount on one screen of the general TOF method.

FIG. 6 is a diagram showing the relationship between the exposure amount of the emission signal and exposure signal on one screen of the general TOF method. FIG. 6 shows the example where the signal accumulation capacity is 800, the exposure amount obtained when the emission signal and the first exposure signal are repeated 16 times is 400, and the exposure amount obtained when the emission signal and the first exposure signal are repeated 16 times is 100. The first emission and exposure, the second emission and exposure, and the no-emission and exposure performed at a series of timings are assumed to be one set, and this set is repeated two times. By this repetition, the sum total of the exposure amounts by the first exposure signal is 800, which is the signal accumulation capacity. While, the sum total of the exposure amounts by the second exposure signal is 200. In other words, in the above-mentioned example in the general TOF method, the maximum reception amount is kept at 200, and the S/N decreases.

Furthermore, in the general distance-measuring/imaging apparatus, the photoelectron holding unit in a certain emission signal period always firstly becomes saturated. Therefore, when the emission intensity or the repeat count of light reception is adjusted so that the photoelectron holding unit in the emission signal period becomes close to the saturation point, the maximum reception amount in another emission signal period cannot arrive at the whole of the saturated amount of the photoelectron holding unit. As a result, the S/N decreases, and the distance measurement accuracy decreases.

This problem is remarkable in the following cases:
the emission intensity is low;
the exposure amount by the second exposure signal is small (the distance to the measuring object is short);
the amount of background light is large; and
the cell size (area of the light receiving unit or the like) of the solid imaging element forming the imaging unit is small.

Differently from this device, the distance-measuring/imaging apparatus of the present exemplary embodiment can prevent the above-mentioned characteristic degradation. Hereinafter, the detail is described.

The lower part of FIG. 3 shows the detail of the operation of distance-measuring/imaging apparatus 1 of the present exemplary embodiment, specifically, shows the example of the relationship between the generating timings of the emission signal and exposure signal by signal generation unit 30. Signal generation unit 30 outputs the first exposure signal and second exposure signal in which the receiving timings of the light reflected from the measuring object are mutually different with respect to the emission signal. Imaging unit 10 performs exposure in response to the first exposure signal so that the whole of the light reflected from the measuring object is included, and obtains a first exposure amount corresponding to the exposure. Imaging unit 10 also performs exposure in response to the second exposure signal so that the second exposure amount increases as the light reflected from the measuring object lags behind the emission timing. In order to detect an offset component of the background light or the like, the generation of the emission signal is stopped, and exposure is performed under the same condition as that of the first exposure signal and second exposure signal. While, the upper part of FIG. 3 shows the example of timing relationship on one screen between the emission signal and the first exposure signal and second exposure signal. In the first emission/exposure period, the first exposure signal is output repeatedly m times, and the emission signal is output repeatedly y times. Then, in the second emission/exposure period, the emission signal is output repeatedly m times, and the second exposure signal is output repeatedly m times. Then, in the no-emission/ exposure period, the output of the emission signal is stopped, and the exposure signal is output repeatedly m times under the same condition as that of the first exposure signal and second exposure signal. This series of timings is assumed to be one set, N sets of outputs are repeated, and then the accumulated exposure signal is output.

Here, the sum total of exposure amounts s0 by the first exposure signal is denoted with S0, the sum total of exposure amounts s1 by the second exposure signal is denoted with S1, the sum total of the exposure amounts by the background light is denoted with BG, the emission signal width of the direct light to be radiated is denoted with T0, and the light velocity (299,792,458 m/s) is denoted with c. Distance L can be calculated on the basis of expression 2.

$$L = \frac{c \cdot T_0}{2} \times \left(\frac{S1 - BG}{S0 - BG}\right) \times \frac{y}{m} \quad \text{[Expression 2]}$$

Distance-measuring/imaging apparatus 1 of the present exemplary embodiment selects y and m so that each of the following sum totals approaches the maximum capacity for signal accumulation. The sum totals are:
  the sum total of the exposure amounts by the first exposure signal when the emission signal is repeated y×N times; and
  the sum total of the exposure amounts by the second exposure signal when the emission signal is repeated m(independent of y)×N times.

Thus, distance-measuring/imaging apparatus 1 can set a large maximum reception amount for each of the sum total of the exposure amounts by the first exposure signal and the sum total of the exposure amounts by the second exposure signal. Therefore, a high S/N and a high distance measurement accuracy can be achieved.

Figure 7:
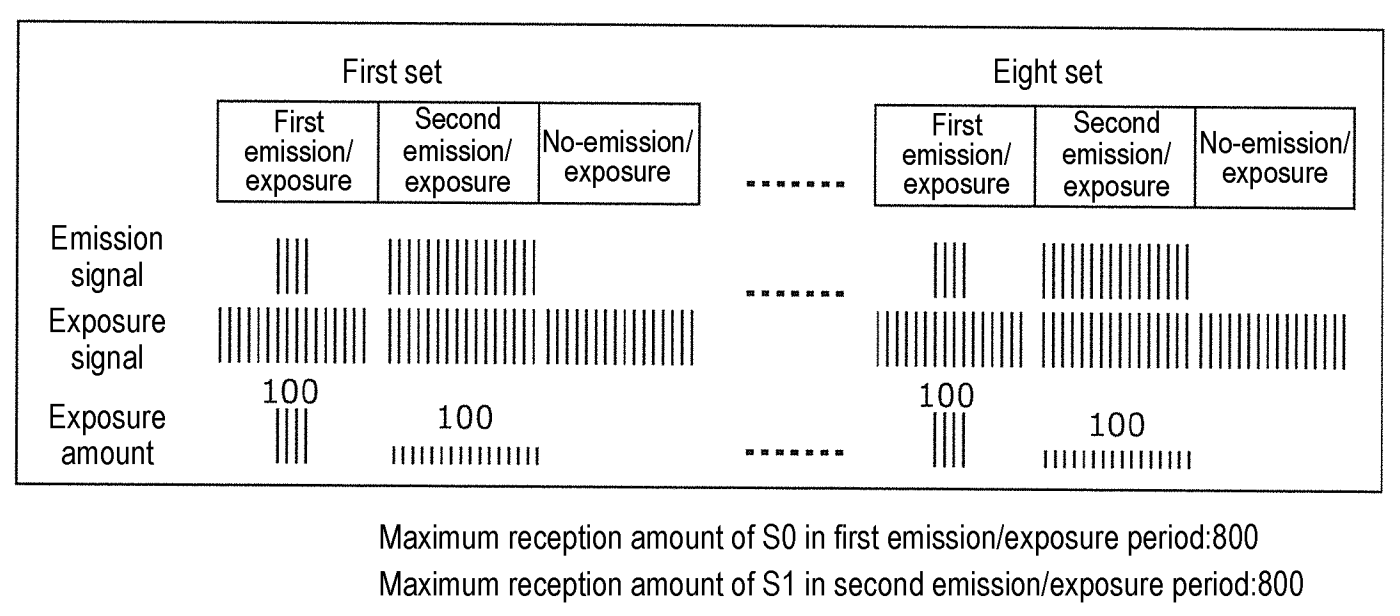

FIG. 7 is a diagram showing an example of the relation of the exposure amount on one screen of the distance-measuring/imaging apparatus in accordance with the first exemplary embodiment. FIG. 7 shows the example where the signal accumulation capacity is 800, the exposure amount obtained when the emission signal and the first exposure signal are repeated 16 times is 400, and the exposure amount obtained when the emission signal and the first exposure signal are repeated 16 times is 100. Here, the repeat count of the emission signal in the first emission/exposure period is set at four, which is ¼ of 16 times. Therefore, the exposure amount in the first emission/exposure period is 100, which is ¼ of 400. By assuming the series of timings to be one set and repeating eight sets, each of the sum total of the exposure amounts by the first exposure signal and the sum total of the exposure amounts by the second exposure signal is 800, which is the signal accumulation capacity. In this case, the repeat count of the emission signal in the first emission/exposure period is ¼ of the repeat count of the emission signal in the second emission/exposure period, so that distance L can be calculated on the basis of expression 3.

$$L = \frac{c \cdot T_0}{2} \times \left(\frac{S1 - BG}{S0 - BG}\right) \times \frac{1}{4} \quad \text{[Expression 3]}$$

First Modified Example of the First Exemplary Embodiment

Figure 8:
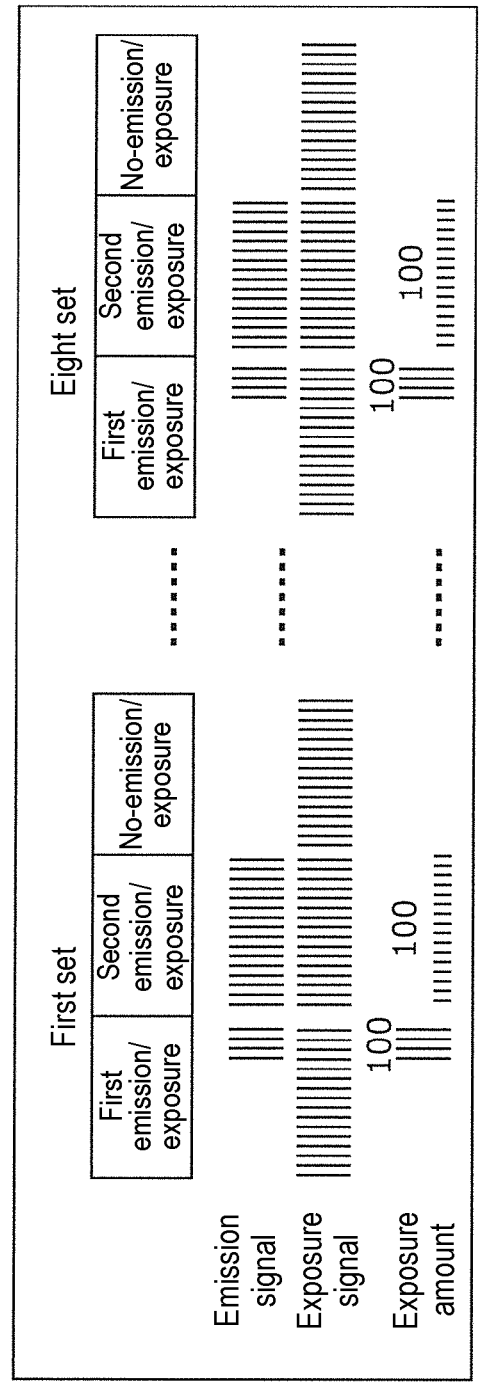
FIG. 8 is a diagram showing an example of the relation of the exposure amount on one screen of a distance-measuring/imaging apparatus in accordance with a first modified example of the first exemplary embodiment.

FIG. 8 is a diagram showing an example of the relation of the exposure amount on one screen of a distance-measuring/imaging apparatus in accordance with a first modified example of the first exemplary embodiment. In the example of FIG. 8, the exposure amount and the signal repeat count are the same as those of FIG. 7. Also in the case of the present modified example, distance L can be calculated on the basis of expression 3. The modified example differs from the example of FIG. 7 in that, in the first emission/exposure period, the output timings of the emission signal whose repeat count (four) is ¼ of the repeat count (16) of the first exposure signal are moved closer to the second emission/exposure period. In other words, signal generation unit 30 outputs the emission signal and exposure signal in the emission/exposure period in which the repeat count is lower, of the first emission/exposure period and second emission/exposure period, at the generating timings that are moved closer to the emission/exposure period in which the repeat count is higher.

Also in this example, each of the sum total of the exposure amounts by the first exposure signal and the sum total of the exposure amounts by the second exposure signal is 800, which is the signal accumulation capacity, and hence the maximum reception amount is large. Therefore, a high S/N and a high distance measurement accuracy can be achieved. Furthermore, the time difference between the first emission/exposure period and second emission/exposure period is short, so that distance measurement of even a measuring object moving fast can be performed accurately.

Second Modified Example of the First Exemplary Embodiment

Figure 9:
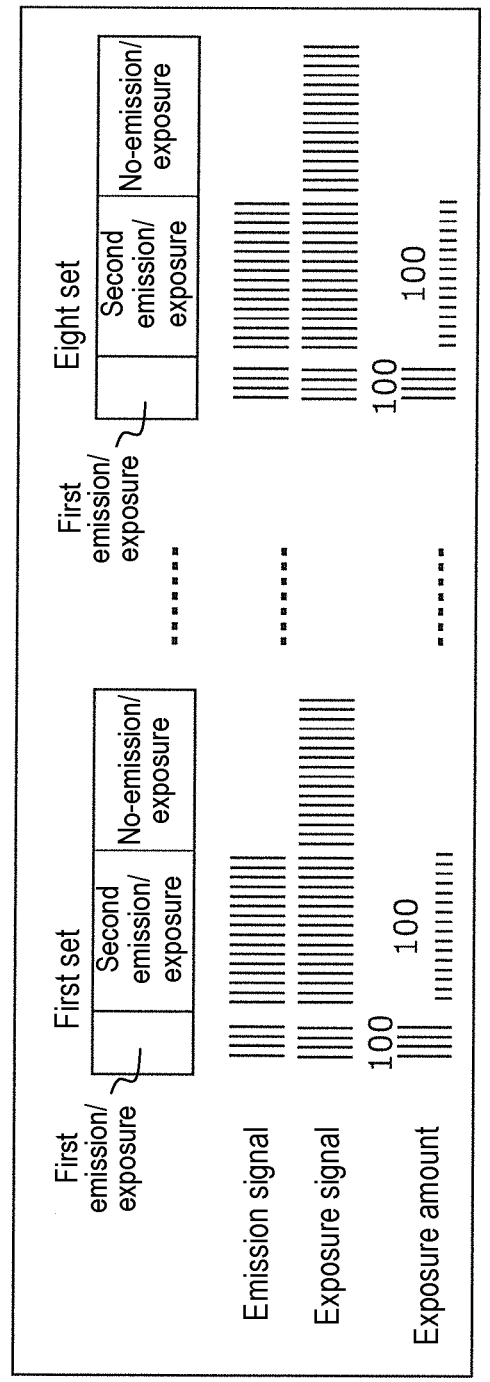
FIG. 9 is a diagram showing an example of the relation of the exposure amount on one screen of a distance-measuring/imaging apparatus in accordance with a second modified example of the first exemplary embodiment.

FIG. 9 is a diagram showing an example of the relation of the exposure amount on one screen of a distance-measuring/imaging apparatus in accordance with a second modified example of the first exemplary embodiment. In the example of FIG. 9, the exposure amount and the signal repeat count are the same as those of FIG. 7. The modified example differs from the example of FIG. 7 in that, in the first emission/exposure period, the repeat count of not only the emission signal but also the first exposure signal is set ¼ (four times) of the repeat count in FIG. 7, and the output timings of both the emission signal and first exposure signal are moved closer to the second emission/exposure period. Also in this example, each of the sum total of the exposure amounts by the first exposure signal and the sum total of the exposure amounts by the second exposure signal is 800, which is the signal accumulation capacity, and hence the maximum reception amount is large. Therefore, a high S/N and a high distance measurement accuracy can be achieved. In the present modified example, the repeat count of the emission signal in the first emission/exposure period is ¼ of the repeat count of the emission signal in the second emission/exposure period, and the sum total of the exposure amounts by the background light is ¼ of that in the no-emission/exposure period. Therefore, distance L can be calculated on the basis of expression 4.

$$L = \frac{c \cdot T_0}{2} \times \left(\frac{S1 - BG}{S0 - BG/4}\right) \times \frac{1}{4} \quad \text{[Expression 4]}$$

Furthermore, the length of the first emission/exposure period becomes short, namely ¼, so that the output frame rate of the TOF signal increases, the traceability to even a measuring object moving fast is also high, and accurate distance measurement can be achieved.

Third Modified Example of the First Exemplary Embodiment

Figure 10:
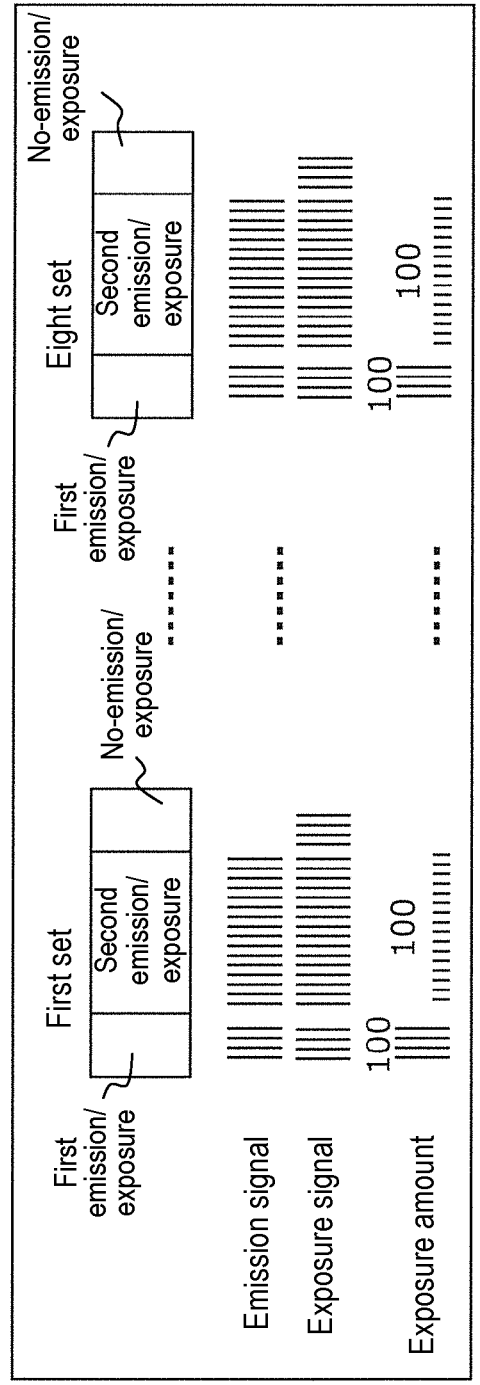
FIG. 10 is a diagram showing an example of the relation of the exposure amount on one screen of a distance-measuring/imaging apparatus in accordance with a third modified example of the first exemplary embodiment.

FIG. 10 is a diagram showing an example of the relation of the exposure amount on one screen of a distance-measuring/imaging apparatus in accordance with a third modified example of the first exemplary embodiment. In the example of FIG. 10, the exposure amount and the signal repeat count are the same as those of FIG. 7. The modified example differs from the example of FIG. 7 in that, in the first emission/exposure period, the repeat count of not only the emission signal but also the first exposure signal is set ¼ (four times) of the repeat count in FIG. 7, and the output timings of both the emission signal and first exposure signal are moved closer to the second emission/exposure period. Also in this example, each of the sum total of the exposure amounts by the first exposure signal and the sum total of the exposure amounts by the second exposure signal is 800, which is the signal accumulation capacity, and hence the maximum reception amount is large. Therefore, a high S/N and a high distance measurement accuracy can be achieved. In the present modified example, furthermore, the repeat count in the no-emission/exposure period is ¼ (four times), similarly to the repeat count of the first exposure signal. In the present modified example, the repeat count of the emission signal in the first emission/exposure period is ¼ of the repeat count of the emission signal in the second emission/exposure period, and the sum total of the exposure amounts by the background light in the second emission/exposure period is four times as large as that in the no-emission/exposure period. Therefore, distance L can be calculated on the basis of expression 5.

$$L = \frac{c \cdot T_0}{2} \times \left(\frac{S1 - 4 \times BG}{S0 - BG}\right) \times \frac{1}{4}$$ [Expression 5]

Furthermore, not only the length of the first emission/exposure period but also the length of the no-emission/exposure becomes short, ¼. Therefore, the output frame rate of the TOF signal further increases, the traceability to even a measuring object moving fast further increases, the power consumption related to the generation of an exposure signal can be reduced to reduce the temperature increase, and accurate distance measurement can be achieved.

In the distance-measuring/imaging apparatuses of the first exemplary embodiment and the modified examples thereof, at least one of the following repeat counts is changed:
the repeat count of at least one of the emission signal and exposure signal in the first emission/exposure period; and
the repeat count of at least one of the emission signal and exposure signal in the second emission/exposure period.

Therefore, a high S/N and a high distance measurement accuracy can be achieved without depending on the emission intensity or the distance to the object. Furthermore, the emission intensity can be suppressed and hence the power consumption can be reduced.

Imaging unit 10 includes a CCD type solid imaging element, so that a high S/N and a high distance measurement accuracy can be achieved without depending on the cell size. The solid imaging element can be downsized, so that the distance-measuring/imaging apparatus can be downsized.

Second Exemplary Embodiment

Hereinafter, the configuration and operation of a distance-measuring/imaging apparatus of the second exemplary embodiment are described while attention is focused on the difference from the first exemplary embodiment.

Figure 11:
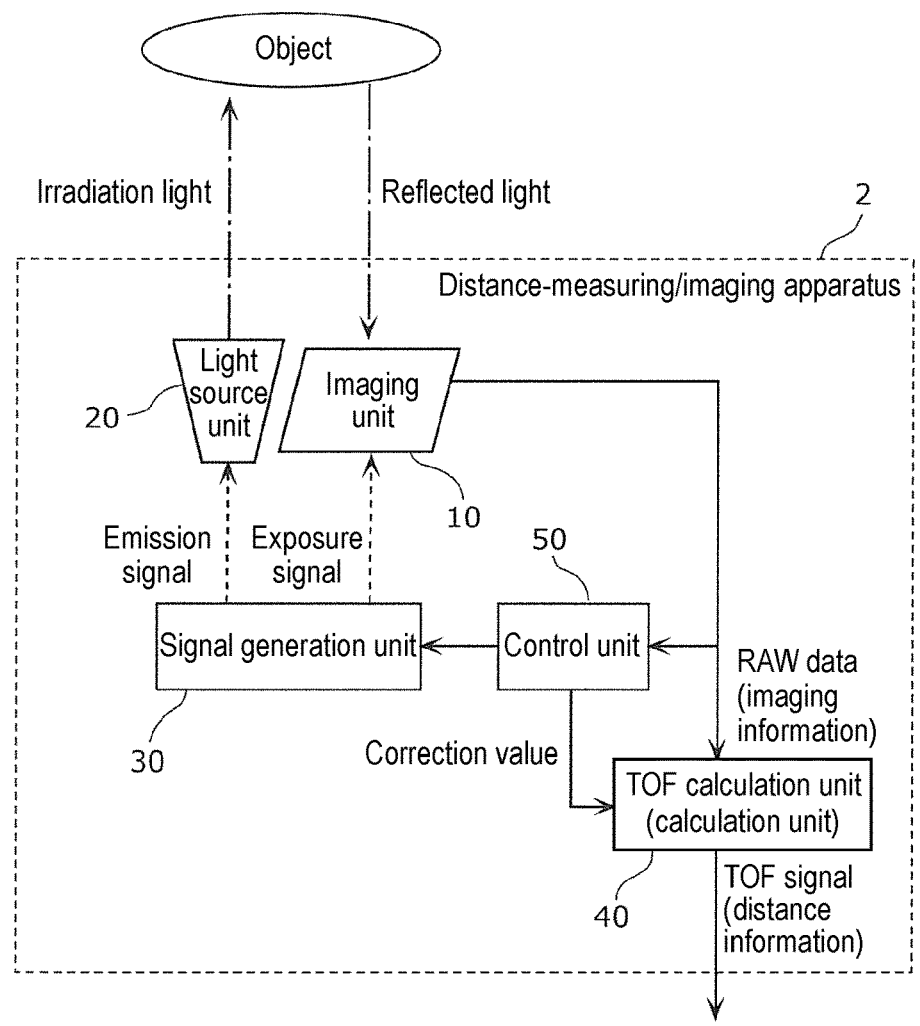
FIG. 11 is a function block diagram showing the schematic configuration of a distance-measuring/imaging apparatus in accordance with a second exemplary embodiment.

FIG. 11 is a function block diagram showing the schematic configuration of the distance-measuring/imaging apparatus in accordance with the second exemplary embodiment. As shown in FIG. 11, distance-measuring/imaging apparatus 2 includes imaging unit 10, light source unit 20, signal generation unit 30, TOF calculation unit 40, and control unit 50.

Signal generation unit 30 generates an emission signal and exposure signal in accordance with the control by control unit 50.

Light source unit 20 emits light at the timing indicated by the emission signal generated by signal generation unit 30.

Imaging unit 10 exposes to light from a region including an object a plurality of times at the timings indicated by the exposure signals generated by signal generation unit 30, acquires RAW data from the sum total of the plurality of exposure amounts.

TOF calculation unit 40 acquires a TOF signal on the basis of the RAW data received from imaging unit 10 and a correction signal received from control unit 50, and outputs the TOF signal.

Control unit 50 detects a signal amount of the RAW data received from imaging unit 10. On the basis of the detected signal amount, control unit 50 performs control for changing the repeat count of at least one of the emission signal and exposure signal generated by signal generation unit 30. Then, control unit 50 outputs the correction signal on the basis of the repeat count.

Specifically, independently of a plurality of exposure periods, control unit 50 performs control for changing the repeat count of at least one of the emission signal and exposure signal on the basis of the signal amount of the RAW data received from a light receiving unit, and outputs the correction signal on the basis of the repeat count. Here, in the exposure periods, the exposure signal for receiving the light reflected from the measuring object is generated at mutually different timings with respect to the emission signal. In other words, even while the emission intensity and the distance to the measuring object vary momently, as shown in FIG. 3, at least one of y and m is varied in real time so that each of the following sum totals approaches the maximum capacity for signal accumulation. The sum totals are:
the sum total of the exposure amounts by the first exposure signal when the emission signal is repeated y×N times; and
the sum total of the exposure amounts by the second exposure signal when the emission signal is repeated m(independent of y)×N times.

In other words, control unit 50 varies and controls at least one of the repeat count in the first emission/exposure period and the repeat count in the second emission/exposure period so that each of the following sum totals approaches the maximum exposure capacity in imaging unit 10. The sum totals are:
sum total S0 of the first exposure amounts obtained by the repetition of exposure in the first emission/exposure period; and
sum total S1 of the second exposure amounts obtained by the repetition of exposure in the second emission/exposure period.

On the basis of the varied and controlled repeat count, control unit 50 outputs a correction signal for correcting the distance information to TOF calculation unit 40.

Thus, the maximum reception amount of each of the sum total of the exposure amounts by the first exposure signal and the sum total of the exposure amounts by the second exposure signal always increases, and a high S/N and a high distance measurement accuracy can be achieved.

First Modified Example of the Second Exemplary Embodiment

Figure 12:
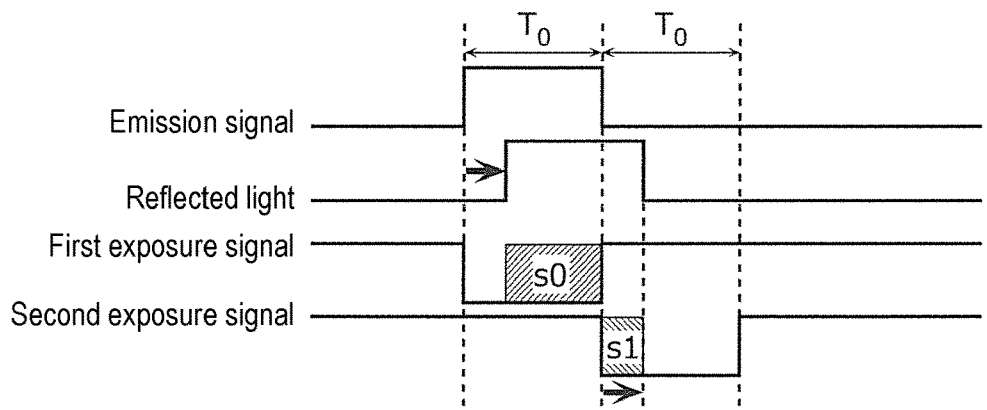
FIG. 12 is a timing chart of an emission signal and exposure signal in a distance-measuring/imaging apparatus in accordance with a first modified example of the second exemplary embodiment.

FIG. 12 is a timing chart of an emission signal and exposure signal in a distance-measuring/imaging apparatus in accordance with a first modified example of the second exemplary embodiment. In FIG. 12, regarding the emission signal and exposure signal generated by signal generation unit 30, the exposure signal includes two exposure signals: a first exposure signal, and a second exposure signal. In these exposure signals, the relative-phase-timings of receiving the light reflected from the measuring object are mutually different with respect to the emission signal. The output period of the first exposure signal includes the start point of the reflected light, and the output period of the second exposure signal includes the end point of the reflected light. The timing of the end point of the first exposure signal with respect to the emission signal coincides with the timing of the start point of the second exposure signal with respect to the emission signal. Furthermore, specifically, the relative phase timings of emission period T0 and the first exposure period are made to coincide with each other, the relative phase timings of the end of the emission period and the start of the second exposure period are made to coincide with each other, and the length of the second exposure period is also set at T0. Thus, the total exposure signal corresponding to one emission pulse is equivalently divided into the first exposure signal and second exposure signal for exposure. Signal generation unit 30 generates the emission signal a plurality of times and the first exposure signal a plurality of times in the first emission/exposure period, and generates the emission signal a plurality of times and the second exposure signal a plurality of times in the second emission/exposure period.

In this case, the signal value of each of the first exposure signal and the second exposure signal also includes a noise component by the background light. Therefore, the exposure in the T0 period in which light emission by light source unit 20 is simply stopped is also time-divided, and a BG signal is also acquired by imaging unit 10.

TOF calculation unit 40 subtracts the noise component by the background light from the signal value, and calculates distance L on the basis of true total exposure signal (S0−BG)+(S1−BG) and true reflection delay signal (S1−BG).

Here, in the case of controlling only the number of emission pulses, when the ratio of the number of emission pulses in the first exposure period to that in the second exposure period is assumed to be 1:n, distance L is calculated on the basis of expression 6.

$$L = \frac{c \cdot T_0}{2} \times \left( \frac{S1 - BG}{n \times (S0 - BG) + (S1 - BG)} \right) \quad \text{[Expression 6]}$$

In the case of controlling both of the number of emission pulses and the number of exposures, when the ratio of the number of emission pulses in the first exposure period to that in the second exposure period is assumed to be 1:n, distance L is calculated on the basis of expression 7.

$$L = \frac{c \cdot T_0}{2} \times \left( \frac{S1 - BG}{(n \times S0 - BG) + (S1 - BG)} \right) \quad \text{[Expression 7]}$$

As discussed above, by dividing the total exposure signal into the first exposure period and second exposure period, each exposure period can be reduced. A distance-measuring/imaging apparatus in which the distance measurement accuracy is improved and the background light tolerant is improved can be achieved.

Second Modified Example of the Second Exemplary Embodiment

Figure 13:
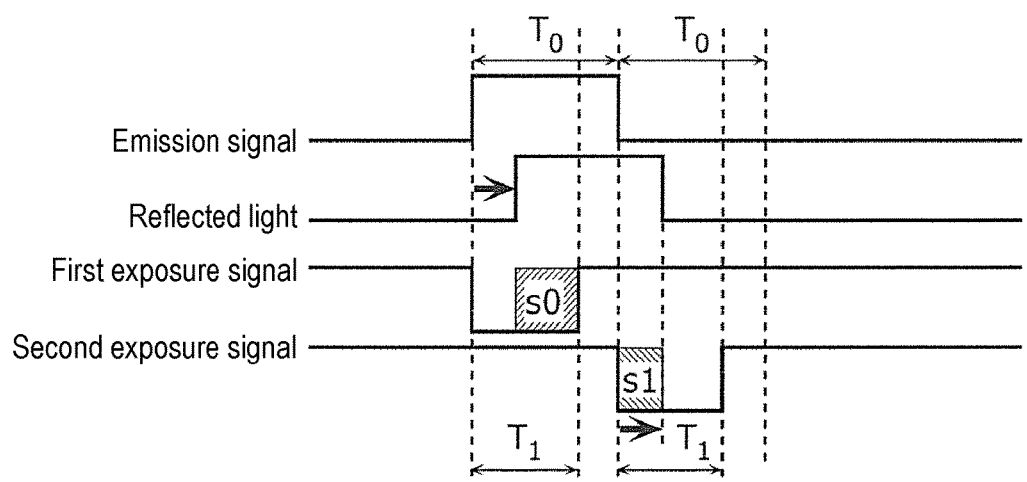
FIG. 13 is a timing chart of an emission signal and exposure signal in a distance-measuring/imaging apparatus in accordance with a second modified example of the second exemplary embodiment.

FIG. 13 is a timing chart of an emission signal and exposure signal in a distance-measuring/imaging apparatus in accordance with a second modified example of the second exemplary embodiment. In FIG. 13, regarding the emission signal and exposure signal generated by signal generation unit 30, the exposure signal includes two exposure signals: a first exposure signal, and a second exposure signal. In the exposure signals, the relative-phase-timings of receiving the light reflected from the measuring object are mutually different with respect to the emission signal. The output period of the first exposure signal includes the start point of the reflected light, and the output period of the second exposure signal includes the end point of the reflected light. The timing of the end point of the first exposure signal with respect to the emission signal exists temporally ahead of the timing of the start point of the second exposure signal with respect to the emission signal. Furthermore, specifically, the relative phase timings of the start of emission period T0 and the start of the first exposure period are made to coincide with each other, the relative phase timings of the end of the emission period and the start of the second exposure period are made to coincide with each other, and the length of each of the first and second exposure periods is set at T1 (T0>T1). Thus, no-sensitivity timing is set in one emission pulse, and the periods before and after the no-sensitivity timing are set to the first exposure signal and second exposure signal for exposure. Signal generation unit 30 generates the emission signal a plurality of times and the first exposure signal a plurality of times in the first emission/exposure period, and generates the emission signal a plurality of times and the second exposure signal a plurality of times in the second emission/exposure period.

In this case, the signal value of each of the first exposure signal and the second exposure signal also includes a noise component by the background light. Therefore, the exposure in the T1 period in which light emission by light source unit 20 is simply stopped is also time-divided, and a BG signal is also acquired by imaging unit 10.

TOF calculation unit 40 subtracts the noise component by the background light from the signal value, and calculates distance L on the basis of total exposure signal (S0−BG)+(S1−BG) and true reflection delay signal (S1−BG).

Here, in the case of controlling only the number of emission pulses, when the ratio of the number of emission pulses in the first exposure period to that in the second exposure period is assumed to be 1:n, distance L is calculated on the basis of expression 6.

In the case of controlling both of the number of emission pulses and the number of exposures, when the ratio of the number of emission pulses in the first exposure period to that in the second exposure period is assumed to be 1:n, distance L is calculated on the basis of expression 7.

As discussed above, by dividing the total exposure signal into three periods: the first exposure period, the second exposure period, and the no-sensitivity period, each exposure period is further reduced. A distance-measuring/imaging apparatus in which the background light tolerance is further improved can be achieved.

Thus, in the distance-measuring/imaging apparatuses of the second exemplary embodiment and the modified examples thereof, at least one of the following repeat counts is changed:
- the repeat count of at least one of the emission signal and exposure signal in the first emission/exposure period; and
- the repeat count of at least one of the emission signal and exposure signal in the second emission/exposure period.

Therefore, a high S/N and a high distance measurement accuracy can be achieved without depending on the emission intensity or the distance to the object. Furthermore, the emission intensity can be suppressed, and hence the power consumption can be reduced. A high S/N and a high distance measurement accuracy can be achieved without depending on the background light.

Imaging unit 10 includes a CCD type solid imaging element, so that a high S/N and a high distance measurement accuracy can be achieved without depending on the cell size. The solid imaging element can be downsized, so that the distance-measuring/imaging apparatus can be downsized.

Thus, the distance-measuring/imaging apparatuses of the present disclosure has been described on the basis of the above-mentioned exemplary embodiments, but the distance-measuring/imaging apparatuses of the present disclosure are not limited to the above-mentioned exemplary embodiments. The present disclosure includes the following examples:
- another exemplary embodiment obtained by combining any components in the above-mentioned exemplary embodiments;
- a modified example obtained by applying, to the above-mentioned exemplary embodiments, various modifications conceived by a person skilled in the art in a range that does not deviate from the scope of the present disclosure; and
- various apparatuses including the distance-measuring/imaging apparatuses of the present disclosure.

The present disclosure can be achieved as a distance-measuring/imaging apparatus having the above-mentioned characteristic configuration, and can be achieved as a distance measuring method of the distance-measuring/imaging apparatus.

In other words, the distance measuring method of the distance-measuring/imaging apparatus of the present disclosure is a distance measuring method of a distance-measuring/imaging apparatus that measures the distance by the light irradiation and the exposure to the reflected light. The distance measuring method includes the following steps:
- a first-exposure-amount acquiring step of acquiring a first exposure amount corresponding to the exposure in a first emission/exposure period;
- a second-exposure-amount acquiring step of acquiring a second exposure amount corresponding to the exposure in a second emission/exposure period; and
- a distance calculating step of calculating and outputting distance information on the basis of the first exposure amount and second exposure amount.

Here, in the first emission/exposure period, the exposure is performed by outputting an exposure signal for commanding the exposure to the reflected light after a lapse of a first delay time from the output timing of an emission signal for commanding the light irradiation. In the second emission/exposure period, the exposure is performed by outputting an exposure signal after a lapse of a second delay time, which is different from the first delay time, from the output timing of the emission signal. In the first-exposure-amount acquiring step and second-exposure-amount acquiring step, a first exposure amount and second exposure amount are acquired by changing at least one of the following repeat counts:
- the repeat count of at least one of the emission signal and exposure signal in the first emission/exposure period; and
- the repeat count of at least one of the emission signal and exposure signal in the second emission/exposure period.

Thus, at least one of the repeat count of at least one of the emission signal and exposure signal in the first emission/exposure period and the repeat count of at least one of the emission signal and exposure signal in the second emission/exposure period is changed. Therefore, a high S/N and a high distance measurement accuracy can be achieved without depending on the emission intensity and the distance to an object. Furthermore, the emission intensity can be suppressed, and hence the power consumption can be reduced.

The above-mentioned exemplary embodiments have described distance-measuring/imaging apparatuses. However, the configurations of the distance-measuring/imaging apparatuses of the present disclosure are applicable not only to a distance-measuring/imaging apparatus for measuring the distance using distance information, but also to a physical quantity detector for accurately detecting (measuring) another physical quantity (for example, shape, temperature, or radiation concentration), and to an imaging apparatus for accurately drawing imaged data.

INDUSTRIAL APPLICABILITY

The distance-measuring/imaging apparatus of the present disclosure can achieve an accurate three-dimensional measurement of a measuring object without depending on the ambient environment. Therefore, the distance-measuring/imaging apparatus is useful for three-dimensional measurement of a person or building, for example.

REFERENCE MARKS IN THE DRAWINGS 1, 2 distance-measuring/imaging apparatus
10 imaging unit
20 light source unit
30 signal generation unit
40 TOF calculation unit (calculation unit)
50 control unit
101 photodiode
102 vertical transfer unit
103 horizontal transfer unit
104 signal charge detection unit

The invention claimed is:
1. A distance-measuring/imaging apparatus comprising:
a signal generation unit for generating an emission signal for commanding a light irradiation and an exposure signal for commanding an exposure to reflected light;
a light source unit for performing the light irradiation by receiving the emission signal;
an imaging unit for performing the exposure by receiving the exposure signal and for acquiring an exposure amount of the reflected light; and
a calculation unit for calculating and outputting distance information based on the exposure amount,
wherein the imaging unit acquires a first exposure amount, of the exposure amount, corresponding to the exposure in a first emission/exposure period, in which the exposure is performed by receiving the exposure signal after a lapse of a first delay time from a receiving timing of the emission signal, and the imaging unit acquires a second exposure amount, of the exposure amount, corresponding to the exposure in a second emission/exposure period, in which the exposure is performed by receiving the exposure signal after a lapse of a second delay time from the receiving timing of the emission signal, the second delay time being different from the first delay time, and wherein the calculation unit calculates the distance information based on the first exposure amount and the second exposure amount acquired by changing at least one of:

a number of repeats of at least one of the emission signal and the exposure signal in the first emission/exposure period; and a number of repeats of at least one of the emission signal and the exposure signal in the second emission/exposure period.

2. The distance-measuring/imaging apparatus according to claim 1, further comprising a control unit used for, changing and controlling at least one of the number of repeats in the first emission/exposure period and the number of repeats in the second emission/exposure period so that each of a sum total of the first exposure amount and a sum total of the second exposure amount approaches a maximum exposure capacity of the imaging unit, the sum totals including:

the sum total of the first exposure amount acquired by repeating the exposure in the first emission/exposure period; and the sum total of the second exposure amount acquired by repeating the exposure in the second emission/exposure period, and outputting a correction signal for correcting the distance information to the calculation unit based on the changed and controlled number of repeats, wherein the calculation unit calculates and outputs the distance information based on the correction signal.

3. The distance-measuring/imaging apparatus according to claim 1, wherein the signal generation unit outputs the emission signal and the exposure signal in an emission/exposure period in which the number of repeats is lower, of the first emission/exposure period and the second emission/exposure period, at generating timings moved closer to an emission/exposure period in which the number of repeats is higher.

4. The distance-measuring/imaging apparatus according to claim 1, wherein the signal generation unit generates a first exposure signal in the first emission/exposure period and generates a second exposure signal in the second emission/exposure period, an output timing of the second exposure signal with respect to the emission signal being different from an output timing of the first exposure signal with respect to the emission signal, an output period of the first exposure signal includes a start point of the reflected light, an output period of the second exposure signal includes an end point of the reflected light, and an end timing of the first exposure signal coincides with a start timing of the second exposure signal, or is temporally ahead of the start timing of the second exposure signal.

5. The distance-measuring/imaging apparatus according to claim 4, wherein the signal generation unit generates the emission signal a plurality of times and the first exposure signal a plurality of times in the first emission/exposure period, and generates the emission signal a plurality of times and the second exposure signal a plurality of times in the second emission/exposure period.

6. A solid imaging element used for a distance-measuring/imaging apparatus, the distance-measuring/imaging apparatus comprising:

a signal generation unit for measuring a distance by a light irradiation and an exposure to reflected light, and for generating an emission signal for commanding the light irradiation and an exposure signal for commanding the exposure to the reflected light;

a light source unit for performing the light irradiation by receiving the emission signal;

an imaging unit including the solid imaging element, and used for performing the exposure by receiving the exposure signal and for acquiring an exposure amount of the reflected light; and a calculation unit for calculating and outputting distance information based on the exposure amount, and calculating the distance information based on a first exposure amount and a second exposure amount acquired by changing at least one of:

a number of repeats of at least one of the emission signal and the exposure signal in a first emission/exposure period; and a number of repeats of at least one of the emission signal and the exposure signal in a second emission/exposure period, wherein the solid imaging element acquires the first exposure amount corresponding to the exposure in the first emission/exposure period, in which the exposure is performed by receiving the exposure signal after a lapse of a first delay time from a receiving timing of the emission signal, and the solid imaging element acquires the second exposure amount corresponding to the exposure in the second emission/exposure period, in which the exposure is performed by receiving the exposure signal after a lapse of a second delay time from the receiving timing of the emission signal, the second delay time being different from the first delay time.

7. The solid imaging element according to claim 1, wherein the solid imaging element includes a CCD (Charge Couple Device) solid imaging element.

8. A distance measuring method of a distance-measuring/imaging apparatus for measuring a distance by a light irradiation and an exposure to reflected light, the distance measuring method comprising:

a first-exposure-amount acquiring step of acquiring a first exposure amount corresponding to the exposure in a first emission/exposure period, in which the exposure is performed by outputting an exposure signal for commanding the exposure to the reflected light after a lapse of a first delay time from an output timing of an emission signal for commanding the light irradiation;

a second-exposure-amount acquiring step of acquiring a second exposure amount corresponding to the exposure in a second emission/exposure period, in which the exposure is performed by outputting the exposure signal after a lapse of a second delay time from the output timing of the emission signal, the second delay time being different from the first delay time; and a distance calculating step of calculating and outputting distance information based on the first exposure amount and the second exposure amount, wherein, in the first-exposure-amount acquiring step and the second-exposure-amount acquiring step, the first exposure amount and the second exposure amount are acquired by changing at least one of:

- a number of repeats of at least one of the emission signal and the exposure signal in the first emission/exposure period; and
- a number of repeats of at least one of the emission signal and the exposure signal in the second emission/exposure period.

\* \* \* \* \*